United States Patent [19]

Brouant

[11] 3,950,699

[45] Apr. 13, 1976

[54] DEVICE FOR MEASURING A SIGNAL HAVING A VERY HIGH NOISE LEVEL

[75] Inventor: Michel Brouant, Boulogne, France

[73] Assignee: Compagnie Industrielle des Telecommunications Cit-Alcatel, France

[22] Filed: Aug. 16, 1974

[21] Appl. No.: 498,300

[30] Foreign Application Priority Data
Aug. 16, 1973 France .............................. 73.29878

[52] U.S. Cl. .............................. 324/76 A; 324/78 J
[51] Int. Cl.² ........................................ G01R 19/00
[58] Field of Search .............. 324/78 J, 79 R, 76 A; 329/111; 331/64; 343/14

[56] References Cited
UNITED STATES PATENTS

| | | | |
|---|---|---|---|
| 3,805,157 | 4/1974 | Acks | 324/76 A |
| 3,863,154 | 1/1975 | Marwell | 324/76 A |

Primary Examiner—R. V. Rolinec
Assistant Examiner—Michael J. Tokar
Attorney, Agent, or Firm—Craig & Antonelli

[57] ABSTRACT

Device for measuring a signal having a very high noise level by an integrator circuit having an operational amplifier, characterized in that the device comprises a means for memorizing a voltage representative of the charge of the capacitor of the integrator circuit, a means for switching the voltage in the memory onto the integration capacitor to bring the voltage of that capacitor to a value close to the asymptotic integration value and a time base for controlling that switching and the reading of the final integration value.

12 Claims, 3 Drawing Figures

DEVICE FOR MEASURING A SIGNAL HAVING A VERY HIGH NOISE LEVEL

The present invention relates to a device for measuring a continuous signal having a very high noise level. It concerns, more particularly the measuring, in a terminal station for telephonic transmissions by submarine cable, of the intermodulation signal transmitted from each of the repeaters equipping a line, that measuring of the intermodulation signal enabling a check on the non-linearity of the repeater in question, having an identification frequency Fi, thus giving the state of the line.

In order to define more clearly the aim to be reached by the device according to the invention, it is specified that in this application, the checking of the non-linearity of a repeater, that is, the $p^{th}$ of the line, having an inherent frequency Fip, is effected by generating, in the terminal station, a measuring wave Fip/2 − F, obtained by selection of the frequency Fip in the set of identification frequencies Σ Fi of the repeaters which is received in the terminal station and modulation of that wave divided by 2 by a carrier whose frequency is F and injecting at the input of the repeater whose order is p the identification frequency Fip/2 given by a local source synchronized with Fip. The intermodulation signal, whose frequency is Fip/2 − (Fip/2 − F) = F, coming from the repeater in question, filtered in a band having a width of 200 c/s, for convenience's sake (with a view to limiting the noise band and to separating the intermodulation signal of the multiplex level signal which is considerably greater), is a useful signal S, whose frequency is F, accompanied by great noise due to the complete connection between the terminal stations and its contingent extension.

It is the useful signal of the intermodulation signal, made continuous by modulation by the carrier whose frequency is F, possibly synchronous, which is to be measured in the 200 c/s band width at the terminal station. That useful signal, contained in the intermodulation signal having a light level, has a useful signal to noise ratio S/B in the order of −20 dB to −30 dB.

If it is required to effect a measuring of the useful signal with a maximum of 1 percent of error which represents 0.1 dB, this leads to the bringing of the ratio S/B from −30 dB to + 20 dB, that is, to the improving of the ratio by 50 dB. Consequently, the width of the measuring band is reduced in the ratio $10^5$, that is, from 200 to 0.002 c/s.

In these conditions, a measuring of the useful signal by the filtering technique is inconceivable, it being impossible to produce the low-pass filter having a bandwidth of 0.002 c/s. The measuring by an integrator having an operational amplifier leads to the adopting of an integration circuit having a minimum time constant of 1/0.002 c/s, that is, 500 seconds; the time necessary for the measuring will consequently be very long.

The present invention aims at reducing the time for measuring such a useful low-level signal having a high noise level. It is essentially based on the known method for measuring by an integrator having an operational amplifier.

The present invention has for its object a device for measuring a signal having a very high noise level, called an input signal, comprising an integrator circuit, constituted by a resistor and a first capacitor, connected up to an operational amplifier having a high input impedance, characterised in that the device it comprises a means for memorizing the output signal of the said integrator circuit and a switching means for switching, during the integration of the input signal, the charge on the said memorizing means onto the said first capacitor bringing its charge to a value close to the asymptotic integration value.

Other characteristics and the advantages of the present invention will become apparent from the description of a preferred embodiment shown in the accompanying drawing. In that drawing.

Figure 1:
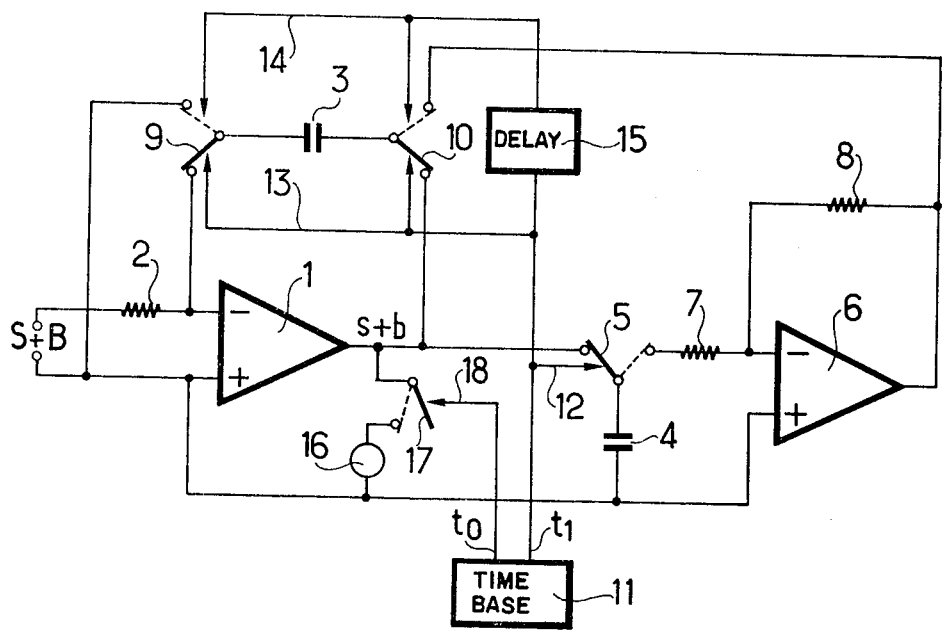
FIG. 1 shows the preferred embodiment of the measuring circuit according to the invention

The circuit for measuring a signal having a high noise level, S + B, supplied preferably by a synchronous demodulator which is not shown, comprises an integrator circuit called a "Miller" circuit having an operational amplifier 1 with a high input impedance to which a resistor 2 is connected at its negative input and a capacitor 3 is connected up between its negative input and its output; the connections of the capacitor 3 to the operational amplifier 1 are switchable. An extra capacitor 4 is connected up between the output of the operational amplifier 1 and its positive input; it is intended for providing the memorizing of the output signal of the integrator. That capacitor 4 for memorizing the output signal is connected up so that it can be switched, by a controlled switch 5, between the output of the operational amplifier 1 and the input of an analogue multiplier constituted by a second operational amplifier 6, having a high input impedance. A first resistor 7 and a second resistor 8 are connected up to the operational amplifier 6. The resistor 7 is connected up between the capacitor 4 which may be switched as shown by the discontinuous lines in FIG. 1 and the negative input terminal of the operational amplifier 6. The resistor 8 is connected up between the negative terminal and the output of the amplifier 6.

The capacitor 3 of the integrator is connected up so that it can be switched on the capacitor 4 through the multiplier circuit 6-7-8: two controlled switches 9 and 10 ensure the connecting of the capacitor 3 on the one hand between the negative input and the output of the operational amplifier 1 and on the other hand between a same terminal connecting the positive inputs of the operational amplifiers 1 and 6 to the capacitor 4 and the output of the operational amplifier 6. A time base 11 ensures the changing over of the switches 5, 9 and 10: at one time $t1$, preferably close to $t1 = 0.7\ \tau$, (see FIG. 3), $\tau$ being the time constant defined by the resistor 2 and the capacitor 3, it makes the capacitor 4 change over from the output of the integrator to the input of the multiplier circuit, as diagrammatically shown by the control line at 12 and makes the capacitor 3 change over from its connection on the operational amplifier 1 to its connection on the operational amplifier 6, as diagrammatically shown by the double control line 13. The switches 9 and 10 are reset in the original position, ensuring the connection of the capacitor 3 to the operational amplifier 1 for reconstituting the integrator circuitry after a short instant following $t1$, approximately one to a few milliseconds, as shown symbolically by the double control wire 14 on which a delay element 15 has been shown.

The time base 11 also ensures, at the end of an established time to, greater than $t1$, close to $1.8\ \tau$, the control of reading for the integration signal. That measuring between the output and the positive input of the operational amplifier 1, or at the terminals of the capacitor 3, is effected by a voltmeter 16 connected with a controlled switch 17 ensuring the connection at the time to as diagrammatically shown by the change-over control 18.

Figure 2:
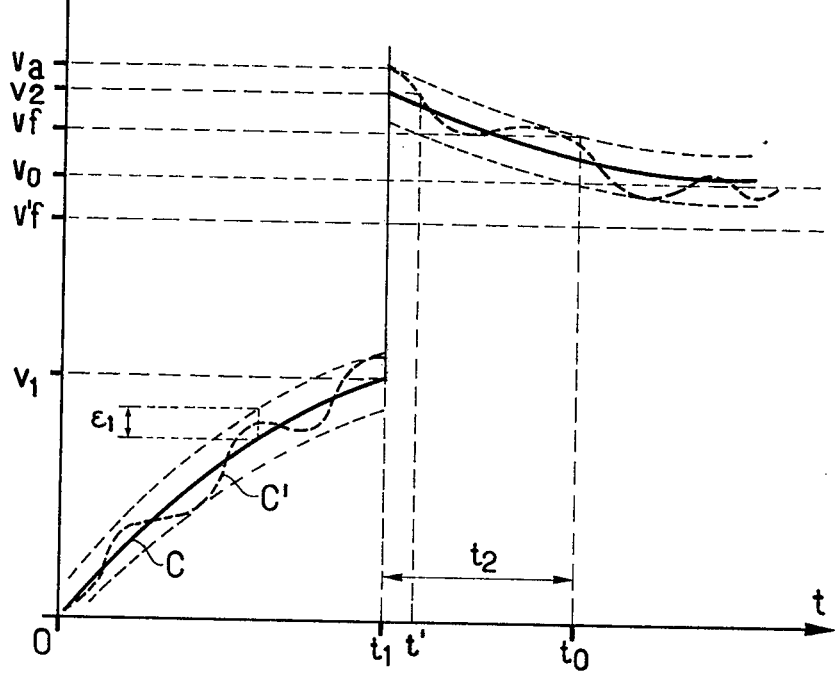
FIG. 2 is a curve illustrating its operation.

FIG. 2 is shown to explain the operation of the measuring device according to FIG. 1. The variation in the time $t$ of the output signal $s + b$ of the integrator 1-2-3 which may be measured by the element 16 has been shown therein where 5 is the integrated useful signal and 6 is the integrated noise component. The input signal $S + B$ is constituted by the useful signal S to be measured accompanied by the noise B: that signal is supplied preferably by a synchronous demodulator not shown in that figure.

At the time 0, the applying of the signal $S + B$ to the input of the measuring device causes its integration by the circuit 1-2-3, the capacitor 3 connected up as shown in continuous lines in FIG. 1, becomes charged. The curve C shows the integration curve of the useful signal S alone, the capacitor 3 becomes charged according to the integration law, to assume, at the time $t1$ the voltage $v1$ such that:

$$v1 = vo (1 - e^{-t1/\tau}) \qquad (1)$$

in which $vo$ is the asymptotic integration value and $\tau$ is the time constant of the circuit RC 2-3.

As the useful input signal has a high noise level, the integration curve C of the circuit 1-2-3 is modified by the presence of a noise or interference signal $b$, due to the noise B, although the latter is very greatly attenuated by the integration; the curve C' which is representative of the signal $v1 + b$ is situated on one side or the other of the curve C, at a maximum distance of $\epsilon 1$ due to the noise.

During the time D to H, the capacitor 4 mounted on the output of the integrator 1 - 2 - 3 becomes charged at a voltage proportional to that of the capacitor 3 and constitutes an analogic memorizing means of the voltage state of the capacitor 3.

At the time $t1$, the change-over of the switches 5, 9 and 10, from their position in continuous lines to their position in discontinuous lines, switches, without taking into consideration the ratio of amplification given by the resistors 7 and 8 connected with the operational amplifier 6, the voltage assumed by the capacitor 4 onto the capacitor 3. The state of the capacitor 3 then changes over from $v1$ to a new value $va$ provided for, close to the value $vo$, by the choice of the gain of the multiplying circuit 6-7-8 so that:

$$va = k\, v1 + k\epsilon \qquad (2)$$

where $k = 1/1 - e^{-t1/\tau}$, $k$ being the ratio between $vo$ and $v1$ and $\epsilon$ is the sum of the errors, the one $\epsilon 1$ due to the noise b and the other $\epsilon 2$ brought in by the operational amplifier 6, ($\epsilon = \epsilon 1 + \epsilon 2$).

After switching and amplification of the voltage on the capacitor 4 onto the capacitor 3, the switches 9, 10 change over again, setting the capacitor 3 in the original position on the operational amplifier 1; (this very short time is not shown in FIG. 2): the new law of evolution of the voltage of the capacitor 3 from its present voltage $va$, under the effect only of the signal S without any noise would be, if that new evolution starting from $va$ were called $v2$:

$$v2 = vo + (va - vo) e^{-t'/\tau} \qquad (3)$$

where the origin of $t'$ is $t1$, that is, taking into account equations (2) and (1):

$$v2 = vo + k\epsilon\, e^{-t'/\tau} \qquad (4)$$

The voltage $v2$ will therefore have a tendency towards the asymptotic value $vo$. The conditions when measuring the useful signal, for which the voltage $v2$ assumes a final value comprised between $vf$ and $v'f$, fixing the relative distance in relation to $vo$ at 1 percent, will be obtained after a minimum time $t2$, counted starting from $t1$ and deduces from the equation (4) where $v2 = vf$ if $t' = t2$ $$t2 = \tau \, \text{Log} \, \frac{K\epsilon}{|vo - vf|}$$

The minimum reading time $to$, $to = t1 = t2$, for reading the voltage assumed by the capacitor 3, that is of the output signal of the integrator 3 is deduced from the equation derived from the equation giving $to$, taking into account the value of $k$:

$$to = t1 + \tau \, \text{Log} \left( \frac{1}{1-e^{-t1/\tau}} \cdot \frac{\epsilon}{|vo - vf|} \right)$$

The calculation shows that this time $to$ is minimum when $t1/\tau = \text{Log } 2$ that is, when $k = 2$ and has a value $to \approx 1.8\,\tau$ when $\epsilon/|vo-vf| \approx 1.5$, the value being determined in the following conditions:

$$\frac{\epsilon}{vo - vf} = \frac{\frac{\epsilon 1}{vo} + \frac{\epsilon 2}{vo}}{\frac{vo - vf}{vo}} \text{ when } \frac{\epsilon 1}{vo} = 0.5\%,$$

$$\frac{\epsilon 2}{vo} = 1\% \quad \frac{|vo - vf|}{vo} = 1\%$$

Figure 3:
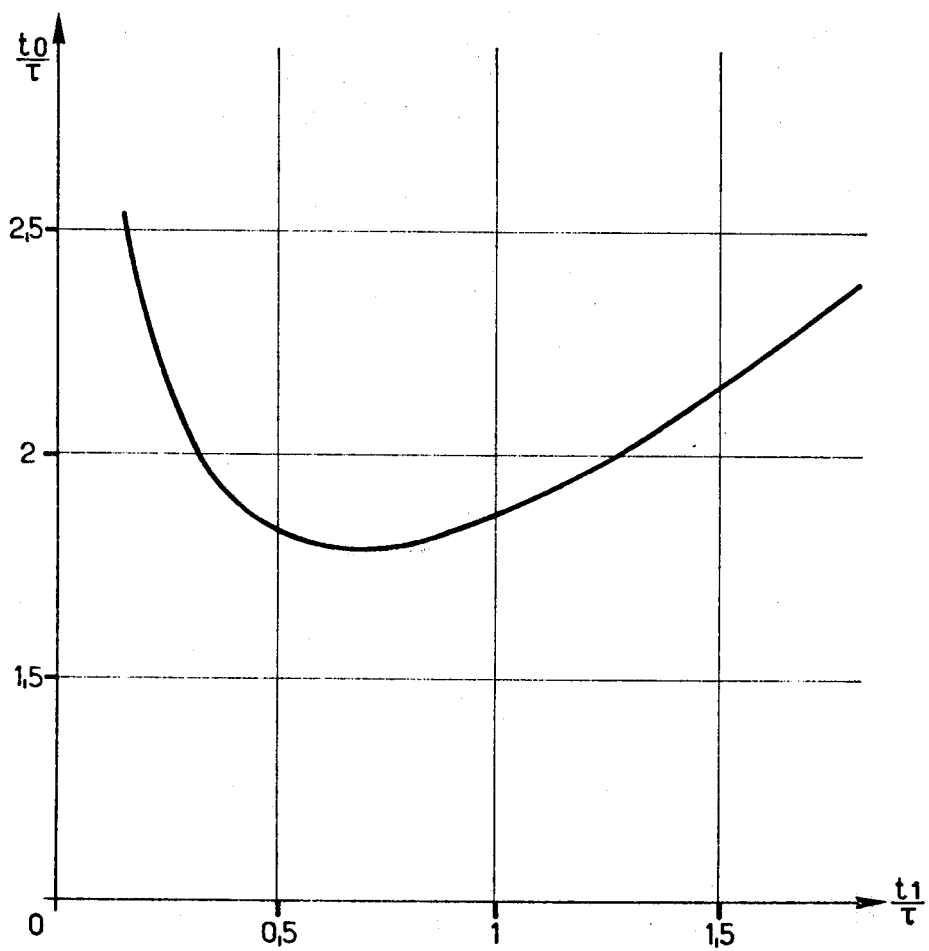
FIG. 3 is a curve illustrating measurements taken.

FIG. 3 illustrates the variations of $to/\tau$ as a function of $t1/\tau$, that is, the evolution of the ratio between the minimum reading time $to$ and the integration time constant $\tau$ as a function of values of the ratio between the value $t1$ chosen for effecting the switching of the voltage from the capacitor 4 on the capacitor 3 and said time constant $\tau$. That FIG. 3 is deduced from tests effected; it shows that for a time $t1$ comprised substantially between 0.3 and 1.4 $\tau$ the minimum reading time, $to$, varies from a value close to 2 $\tau$ to a value close to 1.8 $\tau$, the reading time $to$ assuming the smallest value, close to 1.8 $\tau$, when $t1$ is comprised between 0.5 and 0.9 $\tau$.

A calculation of the minimum reading time, by the conventional method of integration by the circuit 1-2-3 alone would lead where $\epsilon 1/vo = 0.5$ percent, to a possible measuring of the signal in identical conditions of accuracy after a time of 5.3 $\tau$.

The device according to the present invention therefore leads to a reduction in the reading time which is substantially in a ratio of 3.

I claim:
1. Device for measuring a signal with noise superimposed thereon comprising an integrator circuit includ- ing a resistor and a first capacitor connected with a first operational amplifier for providing an asymptotic integration value, means for memorizing a voltage which is representative of the charge of said first capacitor, multiplier circuit means, means for switching through said multiplier circuit means for voltage memorized by said memorizing means onto said first capacitor so as to bring the voltage of said first capacitor to a value approximate to the asymptotic integration value, whereby said integrator circuit approaches the asymptotic value in a shorter period of time.

2. Device according to claim 1, wherein said first capacitor is arranged for switchable connection between said first operational amplifier and said memorizing means.

3. Device according to claim 1, wherein said memorizing means comprises a second capacitor arranged for switchable connection to the output of said first operational amplifier and to the input of said multiplier circuit means.

4. Device according to claim 3, wherein said multiplier circuit means comprises two resistors connected to a second operational amplifier.

5. Device according to claim 1, wherein said switching means switches said memorizing means onto said first capacitor at a time t1, wherein t1 is in the range of $0.2\tau$-$2\tau$, $\tau$ being the time constant defined by the values of the resistor and the first capacitor of said integrator circuit.

6. Device according to claim 5, wherein said multiplier circuit means has a gain for suddenly increasing, at the time $t1$, the voltage of said first capacitor in a ratio proximate to 2.

7. Device according to claim 5, further comprising means for measuring the output signal of said integrator circuit in response to said switching means, said switching means controlling the switching of said memorizing means onto said first capacitor at the time $t1$ proximate to $0.7\ \tau$ and for controlling said measuring means at a reading time of approximately $1.8\ \tau$.

8. Device according to claim 2, wherein said memorizing means comprises a second capacitor arranged for switchable connection to the output of said first operational amplifier and to the input of said multiplier circuit means.

9. Device according to claim 8, wherein said multiplier circuit means comprises two resistors connected to a second operational amplifier.

10. Device according to claim 9, wherein said switching means switches said memorizing means onto said first capacitor at a time $t1$, wherein $t1$ is in the range of $0.2\tau$-$2\tau$, $\tau$ being the time constant defined by the values of the resistor and the first capacitor of said integrator circuit.

11. Device according to claim 10, wherein said multiplier circuit means comprises two resistors connected to a second operational amplifier.

12. Device according to claim 11, further comprising means for measuring the output signal of said integrator circuit in response to said switching means, said switching means controlling the switching of said memorizing means onto said first capacitor at the time $t1$ proximate to $0.7\tau$ and for controlling said measuring means at a reading time of approximately $1.8\tau$.

* * * * *